United States Patent [19]
Watanabe et al.

[11] Patent Number: 5,289,031
[45] Date of Patent: Feb. 22, 1994

[54] SEMICONDUCTOR DEVICE CAPABLE OF BLOCKING CONTAMINANTS

[75] Inventors: Masaharu Watanabe; Yoshiko Kunishima, both of Kawasaki, Japan

[73] Assignee: Kabushiki Kaisha Toshiba, Kawasaki, Japan

[21] Appl. No.: 986,895

[22] Filed: Dec. 8, 1992

Related U.S. Application Data

[63] Continuation of Ser. No. 745,878, Aug. 16, 1991, abandoned.

[30] Foreign Application Priority Data

Aug. 21, 1990 [JP] Japan ................... 2-218228

[51] Int. Cl.⁵ .................... H01L 29/74; H01L 23/58; H01L 29/30
[52] U.S. Cl. .................... 257/617; 257/913; 257/156; 257/41
[58] Field of Search .................... 357/41, 42, 64, 91, 357/40, 52, 88; 257/41, 913, 617

[56] References Cited

U.S. PATENT DOCUMENTS

| | | | |
|---|---|---|---|
| 3,622,382 | 11/1971 | Karl et al. | 357/50 |
| 3,806,371 | 4/1974 | Barone | 357/23.11 |
| 4,564,416 | 1/1986 | Homma et al. | 357/88 |
| 4,608,096 | 8/1986 | Hill | 437/12 |
| 4,716,451 | 12/1987 | Hsu et al. | 357/42 |
| 4,766,086 | 8/1988 | Ohshima et al. | 257/617 |
| 4,920,396 | 4/1990 | Shinohara et al. | 357/42 |
| 5,075,751 | 12/1991 | Tomii et al. | 257/617 |

OTHER PUBLICATIONS

Journal of Applied Physics "Gettering in Silicon", J. S Kang and D. K Schroder, vol. 65, pp. 2974–2985, Apr. 1989.

Solid State Technology, vol. 33, pp. S1–S7 "Contamination Control: Problems and Prospects", T. Hattori, Jul. 1990.

*Primary Examiner*—Rolf Hille
*Assistant Examiner*—Wael Fahmy
*Attorney, Agent, or Firm*—Oblon, Spivak, McClelland, Maier & Neustadt

[57] ABSTRACT

A semiconductor device comprises a semiconductor substrate having first and second major surfaces, semiconductor elements formed on the first surface of the semiconductor substrate, and a blocking layer formed within the substrate at a given distance from the second major surface for blocking the passage of heavy metals through the semiconductor substrate.

9 Claims, 8 Drawing Sheets

SEMICONDUCTOR DEVICE CAPABLE OF BLOCKING CONTAMINANTS

This application is a continuation of application Ser. No. 07/745,878, filed on Aug. 16, 1991, now abandoned.

BACKGROUND OF THE INVENTION

Field of the Invention

The present invention relates to a semiconductor device capable of blocking contaminants and a method of manufacture of the same.

Description of the Related Art

Great advances have been made in supercleaning techniques for cleaning VLSI (very large scale integrated circuit) manufacturing environments and materials used and reducing contamination by VLSI manufacturing apparatus. It is, however, difficult to control each of some hundreds of VLSI manufacturing steps perfectly at a required level of cleanliness. Statistically contamination of VLSIs occurs with some probability. The control limit of the level of cleanness has been improved owing to advances in the supercleaning techniques. However, recent microminiaturization of devices permits even a small amount of contamination to adversely affect device characteristics. For this reason, some method of gettering contaminants has become essential to the manufacture of VLSIs.

Conventional gettering methods are as follows.

(1) A phosphorous gettering method by which, in the final process of manufacture of an LSI, a wafer is subjected to diffusion of phosphorous from its backside and then to heat treatment at 900°-1000° C. in an oxidizing atmosphere, thereby gettering heavy metal contaminants into the phosphorous diffusion layer.

(2) An intrinsic gettering method by which, prior to the formation of device elements, a precipitation nucleus of oxygen is formed by means of low-temperature heat treatment and further oxygen is permitted to continue to precipitate onto the nucleus by means of high-temperature heat treatment, thereby permitting oxygen precipitates to getter contaminants.

(3) A method by which, in place of the oxygen precipitation, an oxidation induced stacking fault (OSF) is formed with backside damage mechanically applied to the backside of a wafer as a nucleus, thereby absorbing contaminants.

However, the above-described methods have the following problems.

One of them is gettering temperature. In the case of phosphorous gettering, it is known that difficulty is involved in diffusing phosphorous sufficiently at a low temperature because of temperature dependence of the diffusion coefficient of phosphorous. The intrinsic gettering requires temperatures at which oxygen satisfactorily precipitates, that is, temperatures of 900° C. or higher. The backside damage requires a temperature at which OSF can grow enough, that is, a temperature of 1000° C. or higher.

When the distance between device elements becomes short or pn junctions associated with sources and drains of FETs become small in depth with the advance of microminiaturization of VLSIs, it is required, in the formation of junctions and control of threshold voltages of FETs, to restrain the diffusion of impurities, such as phosphorous, arsenic, boron, etc., in local doping regions during high-temperature processes to the utmost. That is, the process must be performed at temperatures of 800° to 850° C., which is below 900° C.

However, if a high-temperature process were needed as in the case of the conventional gettering, the processing temperature could not be kept below 900° C.

Another problem is three-dimensional structuring of devices 4M DRAMs and part of 1M DRAMs have been made three-dimensional in their memory cell structure. More and more complex three-dimensional structures will be needed as the storage capacity of DRAMs increases from 16 megabits to 256 megabits. With such structures, it is very hard to evacuate (getter) heavy-metal contaminants from a local strain area to the rear surface of a wafer. It is not too much to say that they cannot be evacuated.

In other words, the progress of fine-structuring of VLSIs makes it difficult to incorporate effective gettering of contaminants into their manufacturing processes because of requirements of low processing temperature and three-dimensional device structure.

As can be seen from the foregoing, the problems with the conventional semiconductor manufacturing methods are that they are very unsuitable for making the structure of devices fine because they require high-temperature heat processes for gettering contaminants, and they cannot provide highly reliable devices because they cannot getter contaminants concentrated in local regions of a complicated device effectively.

SUMMARY OF THE INVENTION

It is a first object of the present invention to provide a highly reliable semiconductor device which requires no high-temperature thermal process necessary for gettering of contaminants and moreover prevents contaminants from concentrating in its device regions.

It is a second object of the present invention to provide a method of manufacturing the above-described semiconductor device easily.

In order to provide such a device and a manufacturing method, an entirely new idea is required in place of the conventional gettering techniques.

To achieve the objects, a semiconductor device according to the present invention comprises:

a semiconductor substrate having first and second major surfaces;

semiconductor elements formed on said first surface of said semiconductor substrate; and a blocking layer formed within said substrate at a given distance from said second major surface for blocking the passage of heavy metals through said semiconductor substrate.

A semiconductor device manufacturing method according to the second invention comprises the steps of:

preparing a first and a second semiconductor substrate;

forming in said first semiconductor substrate a blocking layer for blocking the passage of heavy metals;

bonding said first and second semiconductor substrates together through said blocking layer; and forming semiconductor elements on said first or second semiconductor substrate at a temperature lower than a temperature at which said blocking layer was formed.

A semiconductor device manufacturing method according to the third invention comprises the steps of:

preparing a first and a second semiconductor substrate;

forming in said first semiconductor substrate a blocking layer for blocking the passage of heavy metals;

bonding said first and second semiconductor substrates together through said blocking layer; and forming semiconductor elements on said second semiconductor substrate at a temperature of 1000° C. or below.

It is preferred that the temperature be 800° C. or below, especially 600° C. or below.

Moreover, a semiconductor device manufacturing method according to a fourth invention comprises the steps of:

preparing a semiconductor substrate having first and second major surfaces;

implanting impurity ions into said semiconductor substrate from said second major surface at a concentration exceeding the solubility limit in said semiconductor substrate, thereby forming a blocking layer for blocking the passage of heavy metals;

forming semiconductor elements on said second major surface of said semiconductor substrate.

Furthermore, a semiconductor device manufacturing method according to a fifth invention comprises the steps of:

preparing a semiconductor substrate having first and second major surfaces;

diffusing impurities into said semiconductor substrate from said first major surface, thereby forming a blocking layer for blocking the passage of heavy metals;

depositing a semiconductive layer over said second major surface; and forming semiconductor elements on said second major surface of said semiconductor substrate.

In LSI manufacturing steps, the contamination of the front surface of a semiconductor substrate by heavy metals is hard to occur because it is protected with an insulating layer. According to the present invention, since a blocking layer is formed close to the backside of the substrate, heavy metal contaminants penetrating from the backside is blocked by the blocking layer, thus preventing the contaminants from reaching the element-formed substrate surface through the blocking layer. Thus, most of the contaminants will stay at the backside of the substrate. There is also no fear that the contaminants will rediffuse toward the device-formed substrate surface at the time of thermal processes for the formation of device elements. Therefore, there is no fear that the substrate surface on which device elements are to be formed is always exposed to heavy metal contaminants, permitting highly reliable devices to be easily manufactured.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

A CMOS transistor and a manufacturing method therefor according to a first embodiment of the present invention will be described with reference to FIGS. 1A through 1H.

Figure 1A:
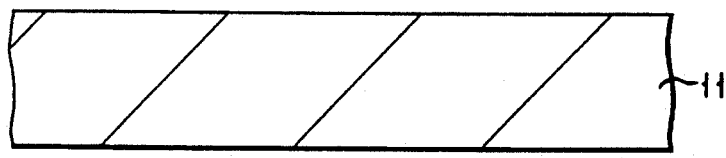
FIGS. 1A through 1H are cross-sectional views of steps of manufacture of a semiconductor device according to a first embodiment of the present invention.

First, as shown in FIG. 1A, an N-type silicon monocrystalline substrate 11 which has a resistivity of 10 Ωcm and a surface parallel to the (100) plane is prepared. The resistivity of the substrate may be equal to or larger than that of a substrate 15 which will be described later. The thickness of the substrate 11 may be equal to or less than that of the usual substrate 15, 625 μm in the present embodiment.

Figure 1B:
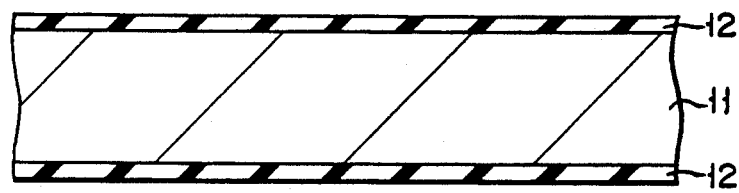
Figure 1C:
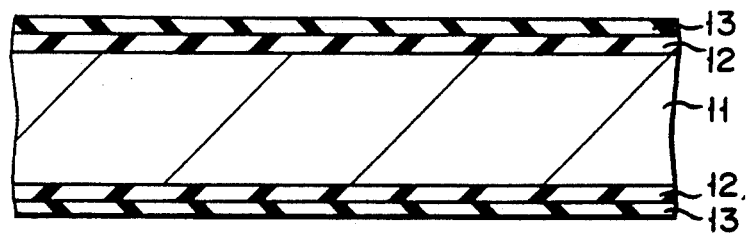

Next, as shown in FIG. 1B, the substrate 11 undergoes oxidation to form oxide layers 12 on its major surfaces. The oxidation is thermal oxidation which is carried out in steam at, for example, 1100° C. The thickness of the oxide layer was 1 μm.

Moreover, as shown in FIG. 2C, silicon nitride layers 13 are deposited over the oxide layers 12. The deposition is carried out by flowing, for example, dichlorsilane and ammonia gas at 800° C. to deposit the silicon nitride layers to a thickness of 50 nm.

Figure 1D:
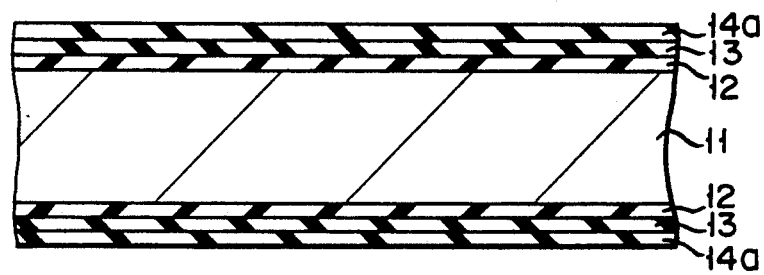

Furthermore, as shown in FIG. 1D, silicon oxides 14a are deposited over the silicon nitride layers 13 by means of, for example, CVD (chemical vapor deposition). The silicon oxides are deposited to a thickness of 1 μm by flowing silane and oxygen gas.

Figure 1E:
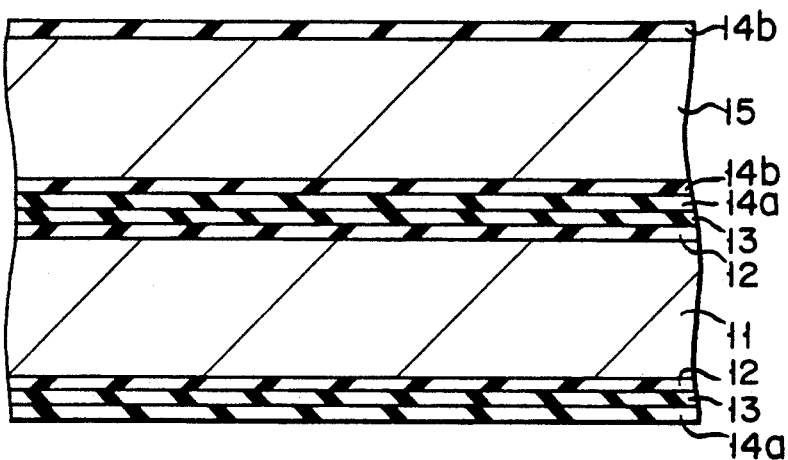

Next, as shown in FIG. 1E, the substrate 11 formed in this way is bonded to the substrate 15 which has only undergone oxidization of its surfaces. The substrate 15 is an N-type silicon monocrystalline substrate having major surfaces parallel to the plane (100) and a resistivity of 10 Ωcm. The major surfaces of the substrate 15 have been subjected to mirror polishing. The substrate 15 is oxidized in steam at 1100° C. in order to improve the adhesive property in the bond step. The thickness of the oxides is 0.1 μm. The substrates 11 and 15 are placed in contact with each other in the nitrogen ambient for 30 min at 1100° C. As a result, the substrates 11 and 15 are strongly bonded to each other through the layers 12, 14a and 14b of oxide and the layer 13 of silicon nitride.

Figure 1F:
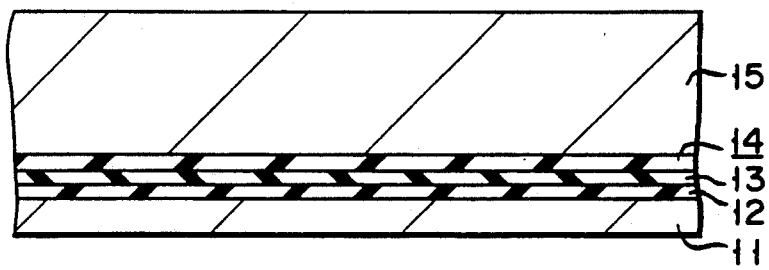

Subsequently, as shown in FIG. 1F, the substrate 11 is removed from the side opposite to the substrate 15 to a thickness of 25 μm. Next, 7μ of the substrate 11 is etched away by a mixture of nitric acid and hydrofluoric acid so as to remove processing strain due to lapping. Subsequently, the surface of the substrate 15 is polished again to have a wafer flatness or site flatness (LTV: Local Thickness Variation) of $0.6\mu$ or less. Of course, both the front and rear surfaces of the resultant structure are well cleaned after polishing. The oxide layer indicated at 14 in FIG. 1F results from the bond between the oxide layers 14a and 14b.

Figure 1G:
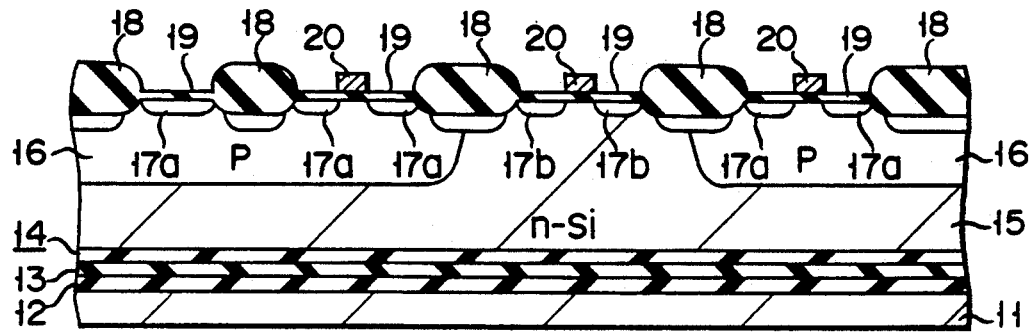

Subsequently, as shown in FIG. 1G, a CMOS structure is produced by means of LSI steps including device isolation. For device isolation, a field oxide layer 18 of, for example, 700 nm thick is selectively formed and then a thin oxide layer 19 of 10 to 20 nm thick serving as a gate oxide layer is formed. Subsequently, an undoped polysilicon layer is subjected to thermal diffusion of phosphorous to form an $n^+$-type polysilicon layer 20 and later patterned using a usual photolithography technique to form gate electrodes 20. Subsequently, ions are implanted in a self-aligned manner with the gate electrodes 20 and the field oxide layer 18 used as a mask, thus forming $p^+$type layers 17b and $n^+$type layers 17a. Reference numeral 16 designates p type wells which have been formed prior to the ion implantation steps. Thereby, the source and drain regions of $p^-$ and $n^-$ type MOSFETs are formed. It is to be noted here that, when p-type impurities are implanted into nMOS regions, pMOS regions are masked by a photoresist. Conversely, when the n-type impurities are implanted into the pMOS regions, the nMOS regions are masked by a photoresist. Use may be made of arsenic as the n-type impurities and boron or boron fluoride as the p-type impurities.

Figure 1H:
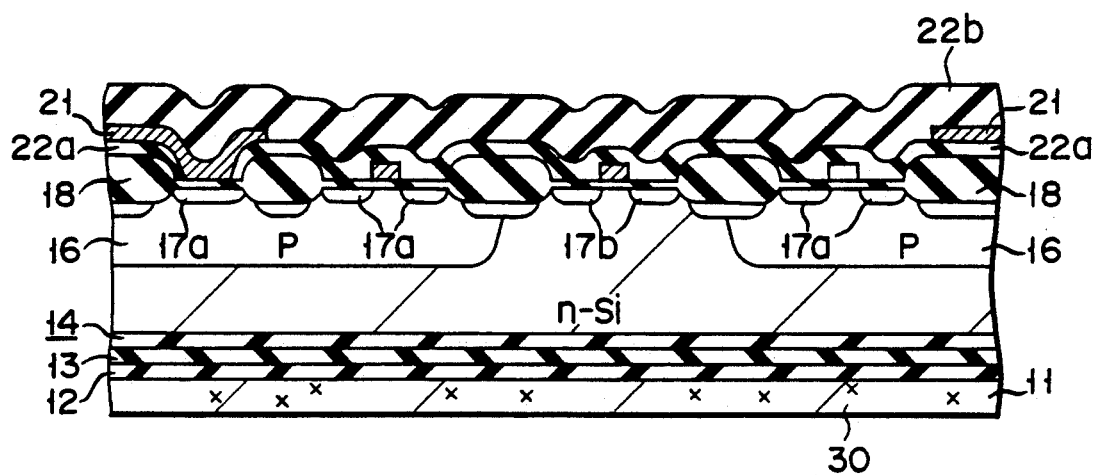

Next, as shown in FIG. 1H, a CVD oxide layer 22a is formed over the entire surface of the resultant structure and openings are cut in predetermined parts of the layer 22a. Subsequently, a second polysilicon layer 21 is deposited over the entire surface of the resultant structure and then patterned using a usual photolithography process. Subsequently, the entire device is covered with an insulating layer 22b of 400 nm thick and contact holes (not shown) are formed. As the insulating layer 22b use is usually made of a layer of phosphorous-doped glass such as PSG, BPSG, etc.

The steps performed so far include all of steps which require temperatures higher than 600° C.

Finally, a metallization step is performed and, after a interconnection pattern (not shown) is formed by fine-line processing, heat treatment is performed in nitrogen ambient for 15 min at 450° C. Subsequently, a passivation layer (not shown) is deposited over the entire surface of the resultant structure in order to protect the entire device.

An LSI composed of CMOS transistors is fabricated by the above-described steps. The manufacturing steps indicated herein are only exemplary and the sequence and the number of the steps may vary, of course, with the type of device to be manufactured.

According to the present invention, a layer that is impervious to heavy metals is formed in a semiconductor substrate in order for heavy-metal contaminants which have entered the substrate from its rear surface not to arrive at device active regions close to its front surface.

That is, at the time of manufacturing of VLSIs, high-temperature processes are performed with the front surface of a substrate except part of openings protected with an oxide layer or a nitride layer. On the other hand, when openings are formed in the front surface of the substrate, the entire rear surface of the substrate is etched and thus the rear surface is frequently exposed during high-temperature processes. For this reason, heavy metals, such as Fe, Ni, Cu, etc., enter the substrate from its backside and arrive at device active regions close to its front surface. This phenomenon may occur only in several tens of seconds. It is the method of the present embodiment that blocks the movement of heavy metals prematurely.

That is, the present invention is intended not to remove heavy metal contaminants by gettering but to keep device active regions clean by forming a blocking layer in a substrate in advance. The blocking layer is preferably a layer which is impervious to heavy metals like an insulating layer such as the $SiO_2$ layer 14, the SiN layer 13, etc.

The front surface of the substrate is subjected to oxidization and etching steps repeatedly as VLSI manufacturing processes progress. The rear surface is also subjected to repeated oxidization and etching. In order to prevent the metal blocking layer from missing by etching, the heavy metal blocking layer must be formed not on the rear surface of the substrate as with back side damage but within the substrate. Thereby, heavy metal contaminants 30 remain in the Si substrate 11. Even if the contaminants 30 remain in the Si substrate 11, the blocking capability in all the VLSI manufacturing steps will not be reduced.

Thereby, the blocking capability in all the VLSI manufacturing steps can be secured. Each time an Si layer on the rear surface is subjected to oxidization and etching, contaminants taken in the Si layer can be removed.

Next, a second embodiment of the present invention will be described with reference to FIGS. 2 and 3. The second embodiment is distinct from the previous embodiment in that the blocking layer is formed by ion implantation. In the second embodiment, like reference numerals are used to designate corresponding parts to those in the previous embodiment and detailed description thereof will be omitted.

Figure 2:
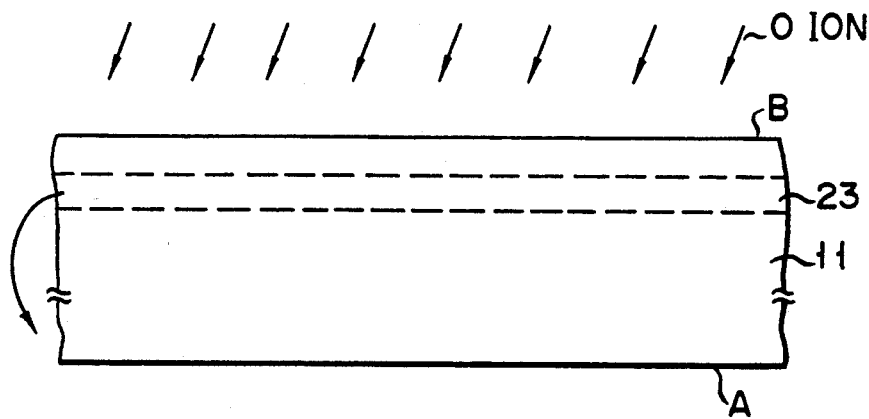
FIG. 2 is a cross-sectional view of a semiconductor device according to a second embodiment of the present invention.

As shown in FIG. 2, oxygen ions are implanted into an Si substrate, which has been prepared in the same manner as the previous embodiment, from its backside B at 1.5 MeV and at a dose of $1.0 \times 10^{17} cm^{-2}$ to form an ion implanted layer 23. Subsequently, by heating the substrate to a desired temperature, for example, 800° C., oxygen is concentrated densely, thereby forming the blocking layer 23.

Subsequently, device elements are formed on the front surface A of the Si substrate by means of the usual manufacturing steps indicated in the previous embodiment.

Figure 3:
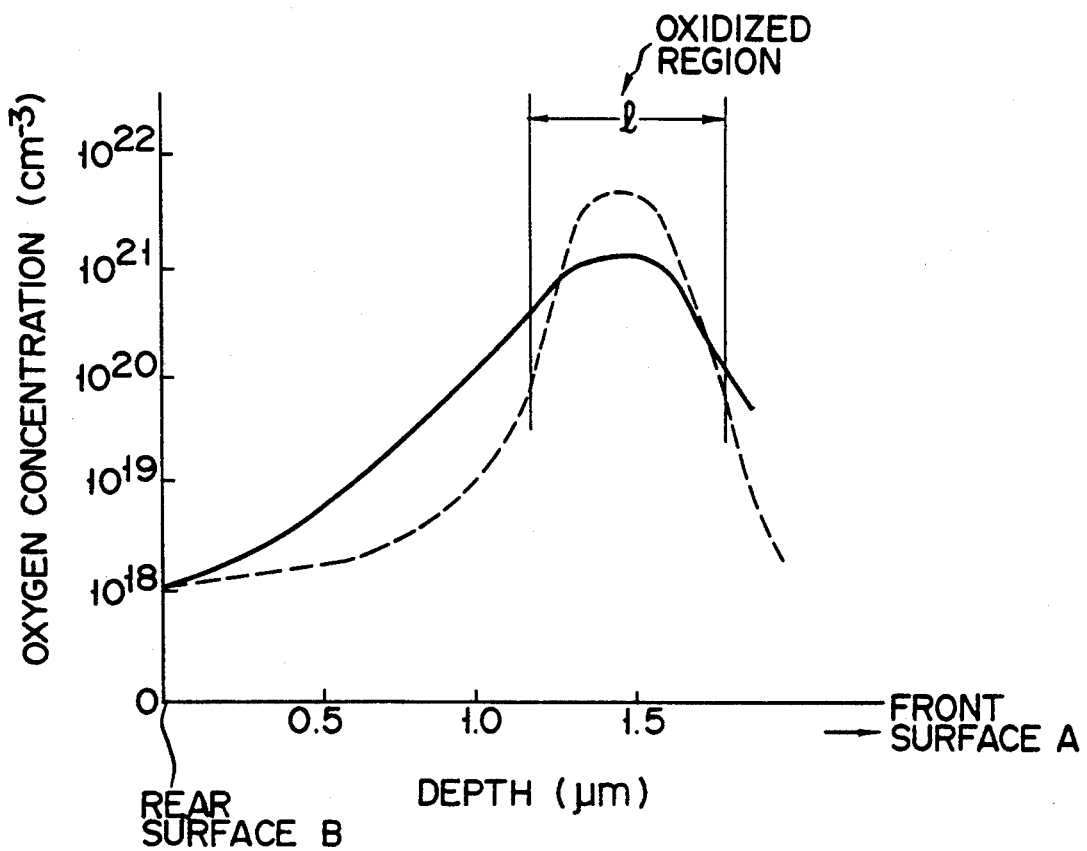
FIG. 3 is a graph of depth versus oxygen concentration in the second embodiment of the present invention.

FIG. 3 illustrates oxygen concentration along the depth from the rear surface B of the substrate. In this figure, a solid line indicates a profile immediately after ion implantation and a broken line indicates a profile after thermal treatment. As can be seen from the figure, a predetermined stoichimetric mixture ratio of the silicon oxide is required in order for the ion implanted layer 23 to act as a blocking layer. That is, it is required that the concentration of oxygen atoms be twice or more that of silicon atoms. This is achieved by concentrating oxygen by means of thermal treatment. Thus, a region having a width of l is formed. The width l of such a region should be at least 100 nm to 700 nm, preferably 200 nm to 700 nm.

In this way an Si substrate provided with a desired blocking layer 23 can be prepared and a device structure can be formed as in the previous embodiment, thereby obtaining the same advantage as the previous embodiment. Moreover, in addition to this result, the blocking layer 23 can be formed by only one ion implantation step, thus permitting the manufacturing steps to be simplified.

Hereinafter, a CMOS transistor according to a third embodiment of the present invention and a manufacturing method therefor will be described with reference to FIG. 4.

Figure 4A:
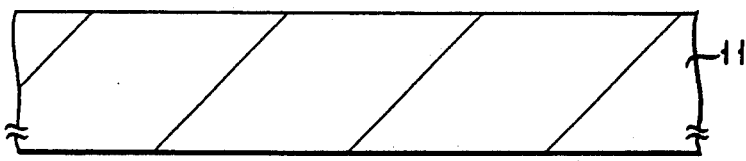
FIGS. 4A through 4H are cross-sectional views of steps of manufacture of a semiconductor device according to a third embodiment of the present invention.

First, as shown in FIG. 4A, an N-type silicon monocrystalline substrate 11 having a resistivity of 10 Ωcm and major surfaces parallel to the (100) plane is prepared.

Figure 4B:
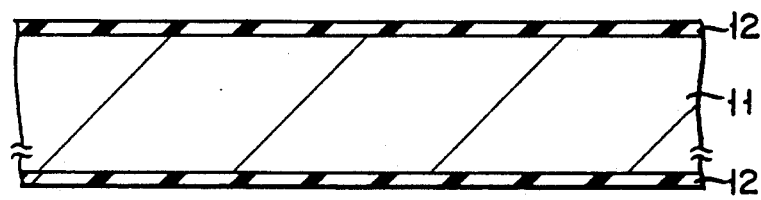

Next, as shown in FIG. 4B, the front and rear surfaces of the substrate 11 are subjected to oxidization to form layers 12 of oxide. The oxidization was carried out in steam at 1100° C. The thickness of the oxide layer was 1μ.

Figure 4C:
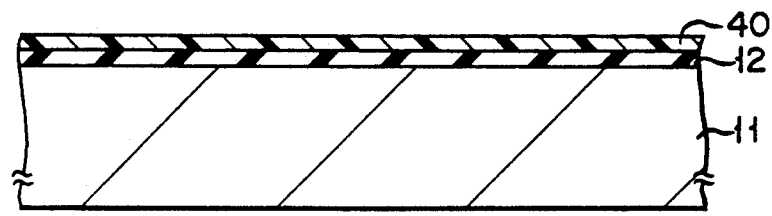

Next, as shown in FIG. 4C, the front surface of the substrate 11 is covered with a photoresist 40 for protection and then the oxide layer on the backside only is etched away.

Figure 4D:
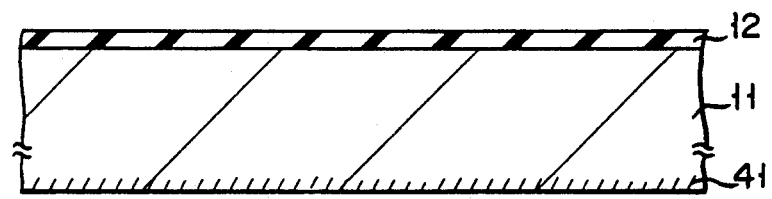

Next, as shown in FIG. 4D, the substrate 11 is subjected to diffusion of phosphorous from its backside alone for an hour in an oxidizing ambient at 1100° C. with $POCl_3$ as a source, thereby forming a phosphorous diffusion layer 41. As a result, the phosphorous diffusion layer 41 comes to have a concentration as high as $5 \times 10^{20}/cm^3$. Subsequently, only a phosphorous glass layer (not shown) formed on the backside of the substrate 11 is etched away.

Figure 4E:
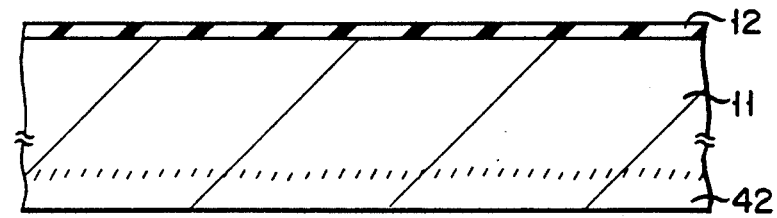

Subsequently, as shown in FIG. 4E, a 10 μm-thick silicon layer 42 is epitaxially grown on the backside of the substrate at 1000° C. using dichlorsilane and hydrogen. The thickness of silicon layer 42 is preferably more than 2 μm. Thereby, a substrate necessary for manufacture of a device is completed.

Figure 4F:
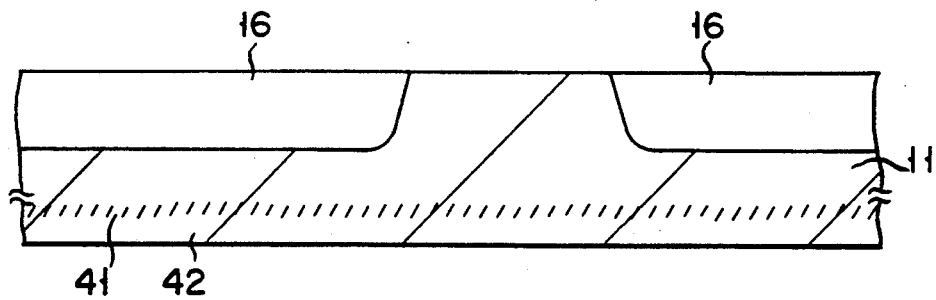

Next, as shown in FIG. 4F, a CMOS is produced by LSI steps for device isolation. First, p-type well regions 16 are formed by, for example, ion implantation.

Figure 4G:
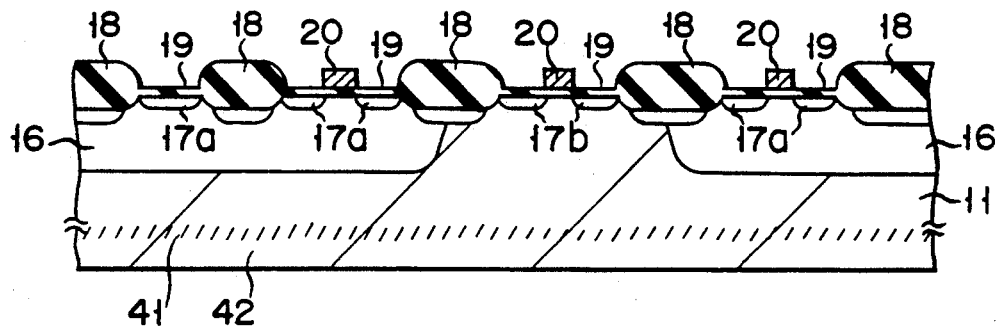

Next, as shown in FIG. 4G, for device isolation a field oxide layer 18 having a thickness of, for example, 700 nm is selectively formed and then a thin oxide layer 19 of 10 to 20 nm thick is formed, which serves as a gate oxide layer. Subsequently, phosphorous is thermally diffused into an undoped polysilicon layer serving as a gate electrode to form an n+type polysilicon layer and then the polysilicon layer is patterned by the use of a usual photolithography process to form gate electrodes 20. Subsequently, with the gate electrodes 20 and the field oxide layer 18 used as a mask, ions are implanted using a self-aligned process to form p+type layers 17b and n+type layers 17a. Thereby, the source and drain regions of pMOS and nMOS are formed. At this point, when p type impurities are implanted into the nMOS regions, the pMOS regions are masked by a photoresist. Conversely, the nMOS regions are masked by a photoresist when n type impurities are implanted into the pMOS regions. Use may be made of, for example, arsenic as the n type impurities and, for example, boron or boron fluoride as the p type impurities.

Figure 4H:
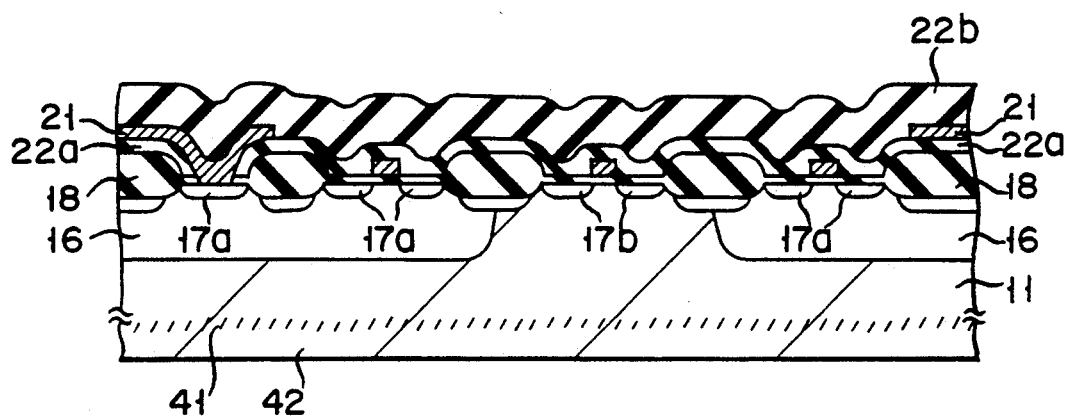

Next, as shown in FIG. 4H, a CVD oxide layer 22a is formed over the entire surface of the resultant structure and openings are cut in predetermined parts of the layer 22a. Subsequently, a second polysilicon layer is deposited over the entire surface of the resultant structure and then patterned using a usual photolithography process, forming interconnection lines 21. Subsequently, the entire device is covered with an insulating layer 22b of 400 nm thick and then contact holes are formed. As the insulating layer 22b use is usually made of a layer of phosphorous glass such as PSG, BPSG, etc. The steps performed so far include all of steps which require temperatures higher than 600° C.

Finally, a metallization step is performed and, after a interconnection pattern (not shown) is formed by fine-line processing, heat treatment is performed in a nitrogen ambient for 15 min at 450° C. Subsequently, a passivation layer (not shown) is deposited over the entire surface of the resultant structure in order to protect the entire device. An LSI composed of CMOS transistors is fabricated by the above-described steps.

The manufacturing steps indicated herein are only exemplary and the sequence and the number of steps may vary, of course, with the type of device to be manufactured.

The third embodiment of the present invention described above will also provide the same advantages as the first embodiment. Moreover, attention should be paid to the following points.

As a barrier the highly doped phosphorous layer 41 which is impervious to heavy metals is used herein. In order for the layer 41 which has been highly doped with phosphorous to trap heavy metal atoms when they pass through the layer, the phosphorous concentration requires to be $10^{20}/cm^3$ or more. It will be more effective if a highly phosphorous-doped layer is formed such that crystal defects remain densely. This can be achieved by forming a highly phosphorous-doped layer by utilizing a phenomenon in which crystal defects such as dislocation are introduced. Further, a two-layer structure of a highly phosphorous-doped layer and a phosphorous-doped glass layer will also be effective. To attain such a two-layer structure, it is required only that a phosphorous-doped glass layer formed at the time of diffusion of phosphorous be employed instead of being removed.

Figure 5A:
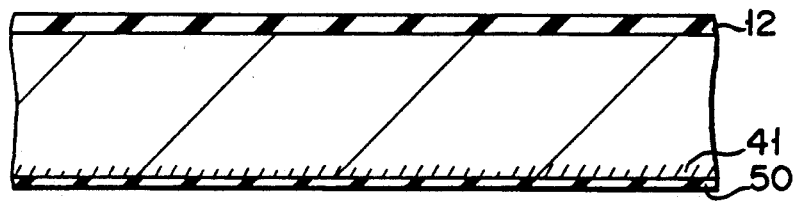
FIGS. 5A and 5B are cross-sectional views of steps of manufacture of a semiconductor device according to a fourth embodiment of the present invention.

A semiconductor device according to a fourth embodiment of the present invention will be described with reference to FIGS. 5A and 5B.

In the third embodiment described above, the phosphorous glass layer is removed for subsequent epitaxial growth after diffusion of phosphorous. The fourth embodiment is distinct from the third embodiment in that manufacturing steps proceed with the phosphorous glass layer left. That is, as shown in FIG. 5A, the phosphorous glass layer 50 is left as it is after the processes shown in FIGS. 4A to 4C in the third embodiment.

Figure 5B:
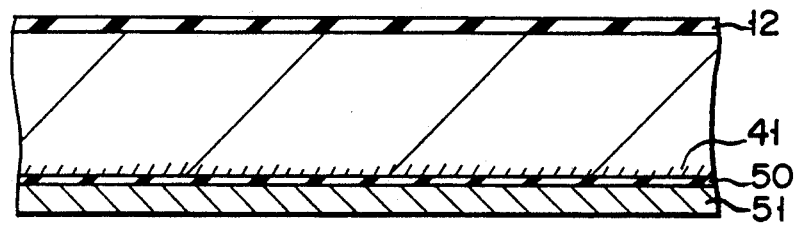

Subsequently, when a silicon layer 51 is grown on the layer, which thickness is more than 2 μm, as shown in FIG. 5B, a single-crystal epitaxial growth layer cannot be obtained and a polysilicon layer will be obtained instead. However, since CMOS structures are not formed in the polysilicon layer, it does not matter even if the resultant layer is either monocrystalline or polycrystalline.

Subsequently, the device forming steps shown in FIGS. 4F to 4H are carried out as in the third embodiment. In this case, the phosphorous diffusion layer and the phosphorous glass layer perform the function of blocking heavy metal contaminants.

The fourth embodiment has the same advantage as the third embodiment.

In place of the epitaxial layer 51 use may be made of a layer formed by another layer deposition technique, for example, sputtering. Moreover, the material of this layer is not limited to silicon (Si). Any material may be used unless it changes the conductivity type of the substrate material. For example, when a Si substrate is used, use may be made of Ge, C (diamond), SiC, etc., which are the group IV semiconductors.

A semiconductor device according to a fifth embodiment of the present invention will be described with reference to FIG. 6.

Figure 6:
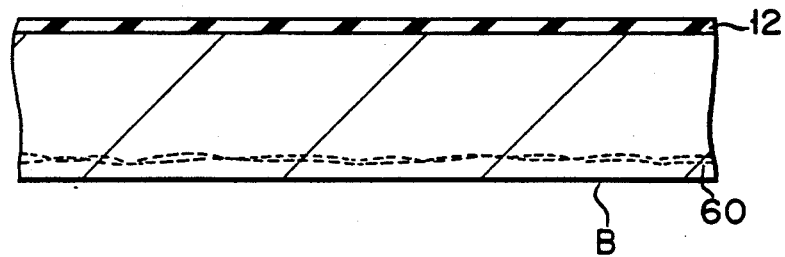
FIG. 6 is a cross-sectional view of a semiconductor device according to a fifth embodiment of the present invention.

First, in this embodiment, after the steps shown in FIGS. 4A to 4C in the third embodiment, carbon is implanted into the backside B of the wafer at 1.5 MeV and at a dose of $2 \times 10^{14}$ /cm$^3$ to form a carbon implanted layer 60 as shown in FIG. 6.

Figure 7:
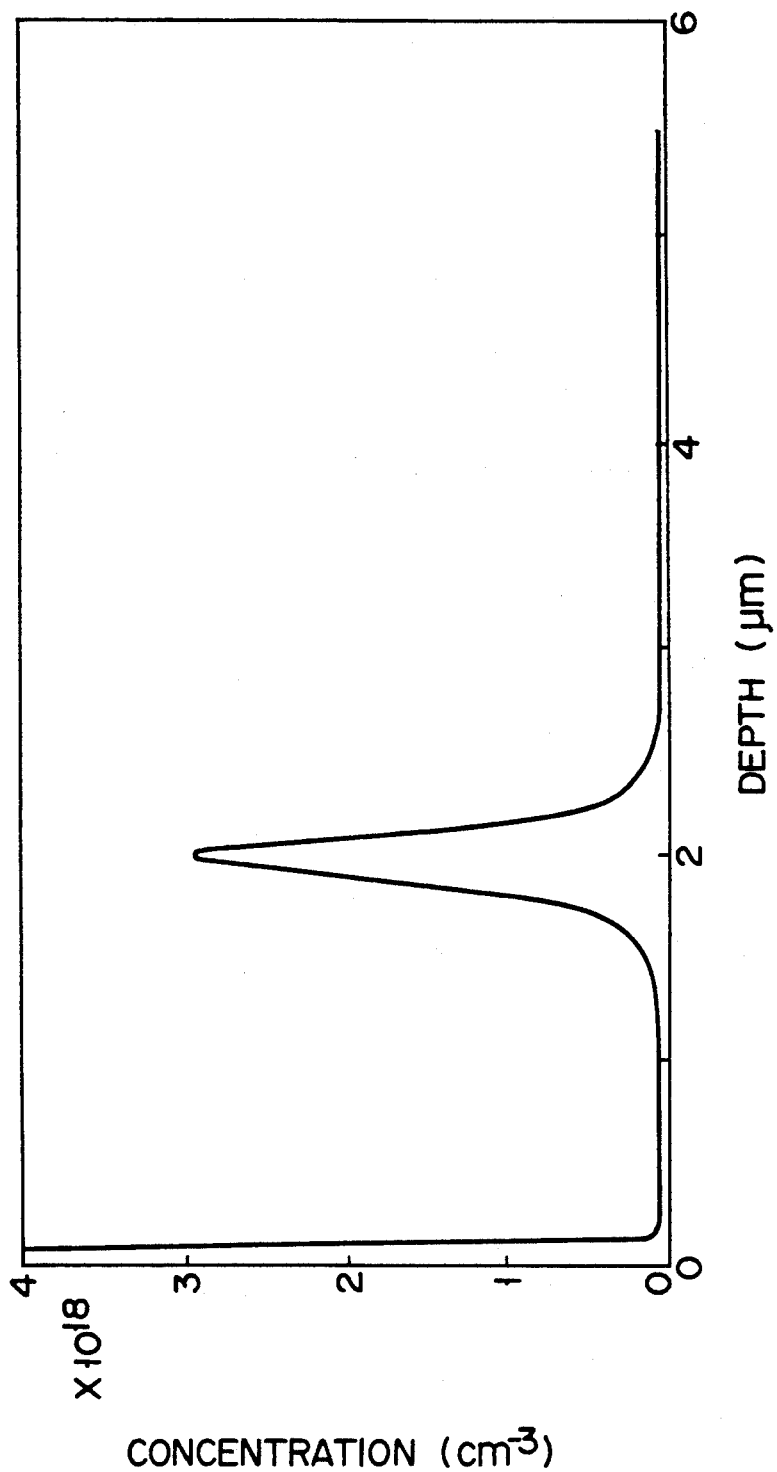
FIG. 7 is a graph of depth versus carbon concentration in the fifth embodiment of the present invention.

The carbon distribution at this point has a peak concentration of $2.9 \times 10^{18}$ /cm$^3$ at 2.0 μm in depth as shown in FIG. 7. The solubility limit of carbon in silicon is $3 \times 10^{17}$ /cm$^3$ or less. In FIG. 7, the carbon concentration from 1.7μ to 2.3μ in depth exceeds this solubility limit. Carbon exceeding the solubility limit precipitates in an LSI manufacturing step to be described later, producing crystal defects densely.

After this step, an LSI composed of CMOSFETs is produced by the steps shown in FIGS. 4F to 4H. This embodiment also provides the same advantage as the third embodiment.

As the blocking layer a layer is used herein which is impervious to heavy metals and has very dense crystal defects. In this embodiment as well, the front surface of the substrate is subjected to repeated oxidization and etching as the VLSI manufacturing process progresses. The backside of the substrate is also subjected to repeated oxidization and etching. Therefore, to prevent the metal blocking layer from being etched away, the heavy metal blocking layer to be formed at the backside, unlike backside damage which is formed on the backside surface, must be formed in an inside region of the substrate. Thereby, the blocking capability can be secured in all the VLSI manufacturing steps.

The ion implantation conditions in this embodiment require that crystal defects be formed so densely as not to permit heavy metal contaminants to pass. In order to form crystal defects densely, it is desired that the concentration of implanted ions exceed the solubility limit. For example, carbon should be implanted to have a peak concentration of $4 \times 10^{17}$ /cm$^3$, while nitrogen should be implanted to have a peak concentration of $5 \times 10^{15}$ /cm$^3$.

The surface of a silicon substrate becomes an oxide layer in the oxidization process of LSI processes. If defects were present very close to the surface, they would be taken in the oxide layer during the oxidization process. To circumvent this, it is required that defects be present at 1 μm or more in depth.

The present invention is not limited to the above-described embodiments. As a result of detailed examinations, it has been found that the following modifications are possible.

(1) The substrate has only to be a semiconductor substrate. In place of Si, the other group IV semiconductors, for example, Ge, may be used. Moreover, compound semiconductors, such as SiGe, GaAs, etc., may also be used.

(2) The device elements to be fabricated are not limited to MOSFETs. MISFETs or Schottky-junction FETs may be fabricated instead. In addition, the device elements may be other elements, such as bipolar transistors, MOS capacitors, diodes, etc.

(3) Instead of using phosphorous to form the blocking layer, use may be made of other impurities exhibiting the other conductivity type, for example, boron or the other group III, IV and V impurities which cause no increase of leak current.

(4) Instead of using oxygen and carbon to form the ion-implanted blocking layer, use may be made of the other group III, IV and V elements, such as nitrogen, boron, phosphorous, tin, Ge or inert gases such as argon, xenon, krypton, etc.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising:
   a semiconductor substrate having first and second major surfaces;
   semiconductor elements formed on said first major surface of said semiconductor substrate; and
   a blocking layer, formed within said substrate, which spans an entire cross sectional area of said substrate at a given distance from said second major surface, for blocking the passage of heavy metals through said second major surface of said semiconductor substrate into said semiconductor elements, said blocking layer being provided at a position nearer to said second major surface than said first major surface and formed of a chemical compound selected from the group consisting of silicon oxide and silicon nitride.

2. A semiconductor device according to claim 1, in which said blocking layer is formed parallel to said second major surface.

3. A semiconductor device according to claim 1, in which said block layer is formed of a silicon nitride layer.

4. A semiconductor device according to claim 1, in which said blocking layer is formed of a silicon oxide layer.

5. A semiconductor device according to claim 4, in which said silicon oxide layer is an oxygen ion implanted layer.

6. A semiconductor device according to claim 5, in which said oxygen ion implanted layer has a concentration of about $10^{21}$ to $10^{22}$ cm$^{-3}$.

7. A semiconductor device according to claim 6, in which said oxygen ion implanted layer is formed at a depth of several μm from said second surface.

8. A semiconductor device according to claim 1, in which said blocking layer is a phosphorous diffused layer.

9. A semiconductor device according to claim 1, in which said blocking layer is a carbon ion implanted layer.

* * * * *